United States Patent
Inaba

[19]

[11] Patent Number: 6,054,753
[45] Date of Patent: *Apr. 25, 2000

[54] PLASTIC-ENCAPSULATED SEMICONDUCTOR DEVICE EQUIPPED WITH LOC PACKAGE STRUCTURE

[75] Inventor: Takehito Inaba, Tokyo, Japan

[73] Assignee: NEC Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/206,825

[22] Filed: Dec. 7, 1998

[30] Foreign Application Priority Data

Aug. 12, 1997 [JP] Japan .................................... 9-336887

[51] Int. Cl.<sup>7</sup> .......................... H01L 23/00; H01L 23/495
[52] U.S. Cl. ......................... 257/646; 257/646; 257/693; 257/691; 257/690; 257/692; 257/673
[58] Field of Search ..................................... 257/666, 690, 257/693, 696, 698, 676, 673, 691

[56] References Cited

U.S. PATENT DOCUMENTS

| | | | |
|---|---|---|---|
| 5,252,854 | 10/1993 | Arita et al. | 257/691 |
| 5,331,201 | 7/1994 | Nishino | 257/691 |
| 5,359,224 | 10/1994 | Heinen et al. | 257/691 |
| 5,394,008 | 2/1995 | Ito et al. | 257/691 |
| 5,428,247 | 6/1995 | Sohn et al. | 257/691 |
| 5,534,729 | 7/1996 | Russell | 257/691 |
| 5,545,920 | 8/1996 | Russell | 257/691 |
| 5,585,665 | 12/1996 | Anjoh et al. | 257/691 |
| 5,648,680 | 7/1997 | Ogawa et al. | 257/691 |
| 5,801,451 | 9/1998 | Yomauchi | 257/691 |
| 5,821,605 | 10/1998 | Hong et al. | 257/691 |

FOREIGN PATENT DOCUMENTS

| | | | |
|---|---|---|---|
| 6275771 | 9/1994 | Japan | H01L 23/50 |
| 6349875 | 12/1994 | Japan | H01L 21/60 |

*Primary Examiner*—Alexander Oslor Williams
*Attorney, Agent, or Firm*—Hayes, Soloway, Hennessey, Grossman & Hage, P.C.

[57] ABSTRACT

A plastic-encapsulated semiconductor device is provided, which makes it possible to reinforce the power/ground line by a bus-bar without using the over-lead bonding technique. This device is comprised of (a) an IC chip having a surface on which a first plurality of bonding pads and a second plurality of bonding pads are provided, the first plurality of pads being arranged in a central area of the surface and the second plurality of pads being arranged in a peripheral area of the surface; (b) lead fingers whose inner ends are fixed to the surface of the chip, at least one of the fingers serving as a part of a power/ground line for the chip; (c) a bus-bar mechanically and electrically connected to the at least one of the fingers serving as a part of the power/ground line, the bus-bar extending over the surface of the chip and; (d) bonding wires for electrically connecting the inner ends of the fingers and the bus-bar to corresponding ones of the first and second pluralities of bonding pads; and (e) a plastic package for encapsulating the chip, inner portions of the fingers, the bus-bar, and the wires, while protruding outer portions of the fingers. The bus-bar extends over the central area of the surface of the chip so that the wires electrically connecting the first plurality of pads to corresponding ones of the lead fingers do not overlap with the bus-bar.

14 Claims, 5 Drawing Sheets

6,054,753

PLASTIC-ENCAPSULATED SEMICONDUCTOR DEVICE EQUIPPED WITH LOC PACKAGE STRUCTURE

BACKGROUND OF THE INVENTION

1. Field of the Invention

The present invention relates to a plastic-encapsulated semiconductor device with the Lead-On-Chip (LOC) package structure and more particularly, to a plastic-encapsulated semiconductor device equipped with an Integrated Circuit (IC) chip and lead fingers extending over the chip and electrically connected to the bonding pads of the IC chip through metal wires, in which at least one of the lead fingers serving as a power/ground line has a bus-bar extending over the chip and electrically interconnecting the power/ground line with one of the pads of the chip serving as a power/ground terminal.

2. Description of the Prior Art

In recent years, as the operation speed of Dynamic Random-Access Memories (DRAMs), in which a memory IC chip is typically encapsulated by a plastic package, has been becoming higher, the need of reinforcing the power and ground lines in the plastic package of the DRAM has been becoming important more and more in the package design operation. This is due to the following reason.

Specifically, if the electric resistance of the power and ground lines in the plastic package is high, the electric potentials at the power and ground terminals of the memory IC chip tend to fluctuate. This electric potential fluctuation will lower the access speed to the memory cells in the chip. Therefore, the electric resistance of the power and ground lines needs to lower by reinforcing or thicken the power and ground lines according to the increasing operation speed.

A conventional LOC package structure of a plastic-encapsulated semiconductor device (e.g., a DRAM) is shown in FIGS. 1 and 2. In this conventional package, the bonding pads of a memory IC chip are arranged in the central area of its upper surface. Therefore, this arrangement of the bonding pads is termed the "center pad structure".

As shown in FIG. 1, this semiconductor device is comprised of an IC chip 107, bonding pads 101 provided on the top surface 107a of the chip 107, lead fingers 122a, 122b, 122c, and 122d, metal bonding wires 105, and a plastic package 108. Since the chip 107 has the center pad structure, the bonding pads 101 are arranged along a straight line at regular intervals in a central area 110 of the top surface 107a of the chip 107.

First and second double-coated, non-conductive adhesive tapes 106a and 106b are arranged on the top surface 107a of the chip 107 at each side of the central area 110. The coated lower faces of the tapes 106a and 106b are attached to the top surface 107a to be fixed thereon. The tapes 106a and 106b extend in parallel to the row of the bonding pads 101.

The lead fingers 122a, 122b, 122c, and 122d are formed by a metallic leadframe. The inner ends of the lead fingers 122a, 122b, 122c, and 122d serve as bonding areas 103a, 103b, 103c, and 103d, respectively. These bonding areas 103a, 103b, 103c, and 103d are termed "stitches".

The lead fingers 122a and 122b provided on the left side of FIG. 1 are attached at their stitches, 103a and 103b to the coated upper face of the first tape 106a, thereby fixing the lead fingers 122a and 122b to the chip 107. The lead fingers 122c and 122d provided on the right side of FIG. 1 are attached at their stitches 103c and 103d to the coated upper face of the second tape 106b, thereby fixing the inner ends of the lead fingers 122c and 122d to the chip 107.

One of the lead fingers 122a located at the top of FIG. 1 serves as a first power line through which a power supply voltage VCC is supplied to the IC chip 107. One of the lead fingers 122b located at the bottom of FIG. 1 serves as a second power line through which the power supply voltage VCC is supplied to the IC chip 107. The inner end (i.e., the stitch 103a) of the lead finger 122a serving as the first power line and the inner end (i.e., the stitch 103b) of the lead finger 122b serving as the second power line are mechanically and electrically connected to one another through a first bus-bar 104a.

The first bus-bar 104a, which is made of the same material as that of the lead fingers 122a, 122b, 122c, and 122d, is located between the row of the pads 101 and the first tape 106a to extend along them. The first bus-bar 104a has a protruding portion serving as a bonding area (i.e., stitch) 103a' at its middle. This stitch 103a' is located between the group of the lead fingers 122a and the group of the lead fingers 122b. The first bus-bar 104a is attached to the coated upper face of the first tape 106a, thereby fixing the central part of the first bus-bar 104a to the chip 107.

One or the lead fingers 122c located at the top of FIG. 1 serves as a first ground line through which a specific ground potential GND is supplied to the IC chip 107. One of the lead fingers 122d located at the bottom of FIG. 1 serves as a second ground line through which the specific ground potential GND is supplied to the IC chip 107. The inner end (i.e., the stitch 103c) of the lead finger 122c serving as the first ground line and the inner end (i.e., the stitch 103d) of the lead finger 122d serving as the second ground line are mechanically and electrically connected to one another through a second bus-bar 104b.

The second bus-bar 104b, which is made of the same material as that of the lead fingers 122a, 122b, 122c, and 122d, is located between the row of the pads 101 and the second tape 106b to extend along them. The second bus-bar 104b has a protruding portion serving as a bonding area (i.e., stitch) 103b' at its middle. This stitch 103b' is located between the group of the lead fingers 122c and the group of the lead fingers 122d. The second bus-bar 104b is attached to the coated upper face of the second tape 106b, thereby fixing the central part of the second bus-bar 104b to the chip 107, Each of the lead fingers 122a, 122b, 122c, and 122d is electrically connected to a corresponding or adjoining one of the bonding pads 101 at their bonding areas or stitches 103a, 103b, 103c, and 103d by a stitch-bonding process through a metallic bonding wire 105. One of the bonding pads 101, which is located near the center of the chip 107, is electrically connected to the first bus-bar 104a designed for the first and second power lines through a metallic bonding wire 105. Another of the bonding pads 101, which is located near the center of the chip 107, is electrically connected to the second bus-bar 104b designed for the first and second ground lines through a metallic bonding wire 105.

The IC chip 107, the bonding wires 105, the first and second bus-bars 104a and 104b, and the inner portions 102a, 102b, 102c, and 102d of the lead fingers 122a, 122b, 122c, and 122d are encapsulated in the plastic package 108. The inner portions 102a, 102b, 102c, and 102d are termed "inner leads".

Only the outer portions 109a, 109b, 109c, and 109d of the lead fingers 122a, 122b, 122c, and 122d are located outside the package 108, thereby providing input/output (I/O) terminals of this semiconductor device, The outer portions 109a, 109b, 109c, and 109d are termed "outer leads".

With the above-described conventional plastic-encapsulated semiconductor device shown in FIG. 1, as seen from FIG. 2, it is necessary for the bonding wires 105 to be bonded to extend over the intervening bus-bar 104a or 104b. This means that the over-lead bonding technique is essential in the wire-bonding operation for this device.

Therefore, unless the loop height of the bonding wires 105 is large enough, there is a possibility that some of the bonding wires 105 may contact with the bus-bar 104a or 104b in the molding operation of the plastic package 108. As a result, a thin package such as the popular Thin Small Outline L-leaded Package (TSOP) is difficult to be used for the plastic package 108.

On the other hand, a thick package such as a Small Outline J-Leaded Package (SOJ) may be applied to the package 108 by using the over-lead bonding technique, because the satisfactory loop height of the bonding wires 105 is ensured in the thick package. In this case, however, there is a problem that the post-molding spacing between the bonding wires 105 and the bus-burs 104a and/or 104b is unable to be observed or inspected three-dimensionally by the use of a known two-dimensional non-destructive inspection method such as the X-ray inspection in the testing operation.

Moreover, when the over-lead bonding technique is actually applied to a package such as the TSOP, some measure needs to be used to avoid the touch or contact of the bonding wires 105 with the bus-bars 104a and 104b after the molding process of the package 108. Two examples of the measures are shown in FIGS. 3 and 4.

In FIG. 3, half-etched bus-bars 104a' and 104b' are used to increase the post-molding spacing between the bonding wires 105 and the bus-burs 104a' and 104b'. In this case, however, there arises another problem that the fabrication cost of the leadframe becomes higher.

In FIG. 4, insulating layers 114a and 114b are formed or coated to cover the upper faces of the bus-burs 104a and 104b, respectively. In this case, however, there arises another problem that the fabrication cost of the leadframe becomes higher and that the insulating layers 114a and 114b tend to be separated from the molding plastic of the package 108. The separation of the layers 114a and 114b degrades the reliability of the package 108.

SUMMARY OF THE INVENTION

Accordingly, an object of the present invention to provide a plastic-encapsulated semiconductor device that makes it possible to reinforce the power/ground line by a bus-bar without using the over-lead bonding technique.

Another object of the present invention is to provide a plastic-encapsulated semiconductor device that decreases the failure rate due to the contact or touch of bonding wires with a bus-bar.

Still another object of the present invention is to provide a plastic-encapsulated semiconductor device that improves the fabrication yield of a leadframe and the bonding yield of bonding wires.

The above objects together with others not specifically mentioned will become clear to those skilled in the art from the following description.

A plastic-encapsulated semiconductor device according to the present invention is comprised of (a) an IC chip having a surface on which a first plurality of bonding pads and a second plurality of bonding pads are provided, the first plurality of pads being arranged in a central area of the surface and the second plurality of bonding pads being arranged in a peripheral area of the surface; (b) lead fingers whose inner ends are fixed to the surface of the IC chip, at least one of the lead fingers serving as a part of a power/ground line for the IC chip; (c) a bus-bar mechanically and electrically connected to the at least one of the lead fingers serving as a part of the power/ground line, the bus-bar extending over the surface of the IC chip; (d) bonding wires for electrically connecting the inner ends of the lead fingers and the bus-bar to corresponding ones of the first and second pluralities of bonding pads; and (e) a plastic package for encapsulating the IC chip, inner portions of the lead fingers, the bus-bar, and the bonding wires, while protruding outer portions of the lead fingers from the package.

The bus-bar is formed to extend over the surface of the IC chip in such a way that the bonding wires electrically connecting the first plurality of bonding pads to corresponding ones of the lead fingers do not overlap with the bus-bar.

With the plastic-encapsulated semiconductor device according to the present invention, the IC chip has the first plurality of bonding pads and the second plurality of bonding pads. The first plurality of pads are arranged in the central area of the surface of the chip and the second plurality of bonding pads are arranged in the peripheral area of the surface thereof.

Further, the bus-bar is formed to extend over the surface of the IC chip in such a way that the bonding wires electrically connecting the first plurality of bonding pads to corresponding ones of the lead fingers do not overlap with the bus-bar. This means that the bus-bar is formed not to extend to an intervening area between the first plurality of bonding pads and corresponding ones of the lead fingers electrically connected thereto.

Therefore, the power/ground line for the IC chip is able to be reinforced by the bus-bar without using the over-lead bonding technique. This means that the half-etching process of the bus-bar is unnecessary, and a metallic leadframe for the lead fingers can be readily fabricated by a pressing or stamping operation.

Also, since the over-lead bonding technique is unnecessary, there is no possibility that the bus-bar is contacted with the bonding wire or wires. Thus, the failure rate of the semiconductor device due to the contact or touch of the bonding wires with the bus-bar is decreased. This means that the fabrication yield of a leadframe used for the lead fingers and the bonding yield of the bonding wires are improved.

In a preferred embodiment of the device according to the present invention, a non-conductive tape is attached onto the surface of the IC chip. The inner ends of the lead fingers are attached to the tape, thereby fixing the lead fingers to the surface of the IC chip.

In this embodiment, it is preferred that an end of the bus-bar is attached to the tape, because the bus-bar is securely fixed.

In another preferred embodiment of the device according to the present invention, one of the first plurality of bonding pads located near the center of the surface of the IC chip, which serves as a power/ground terminal of the IC chip, is electrically connected to the power/ground line through the bus-bar and a corresponding one of the bonding wires.

In still another preferred embodiment of the device according to the present invention, the lead fingers electrically connected to the second plurality of bonding pads have narrow portions located near the second plurality of bonding pads.

In this embodiment, there is an additional advantage that the bonding wires electrically connecting the second plurality of bonding pads to the corresponding lead fingers are difficult to be contacted with the unwanted, adjoining lead fingers, and at the same time, a bonding operation to bond the bonding wires to the second plurality of bonding pads is facilitated, which is realized without increasing the pitch of the inner ends of the lead fingers.

In a further preferred embodiment of the device according to the present invention, the IC chip is located at a position shifted along a plane parallel to the chip with respect to the outer portions of the lead fingers, thereby decreasing a bending angle of the inner portions of the lead fingers electrically connected to the second plurality of bonding pads.

In this embodiment, there is an additional advantage that the width or thickness of the inner portions of the lead fingers for the second plurality of bonding pads can be increased, thereby raising the strength of a leadframe. This improves further the fabrication yield of a metallic leadframe for the lead fingers and the bonding yield of the bonding wires.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
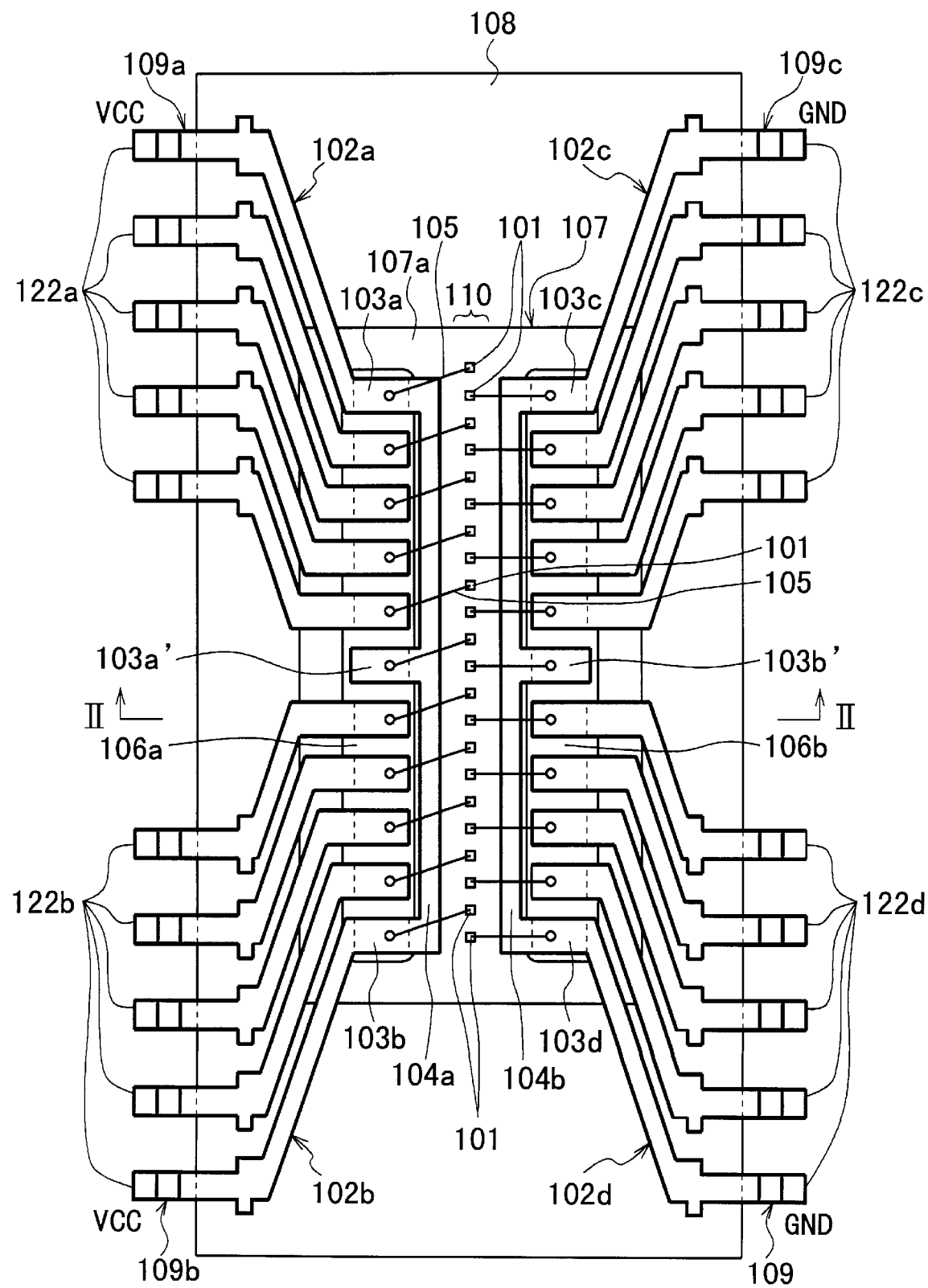
FIG. 1 is a schematic plan view showing the structure of a LOC package of a conventional plastic-encapsulated semiconductor device, in which the upper half of the package is removed.
Figure 2:
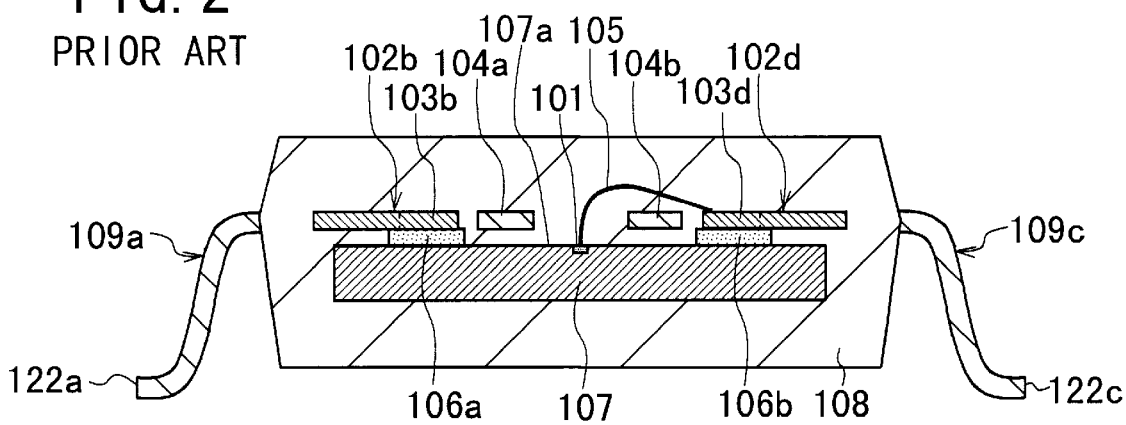
FIG. 2 is a cross-sectional view along the line II—II in FIG. 1.
Figure 3:
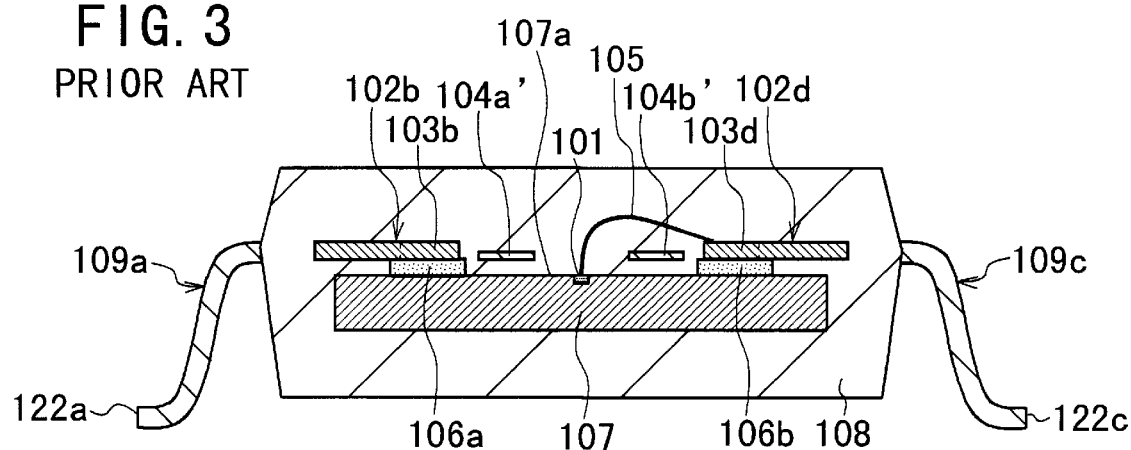
FIG. 3 is a cross-sectional view of another conventional plastic-encapsulated semiconductor device having the bus-bars with half-etched portions, which is along the same line as the line II—II in FIG. 1.
Figure 4:
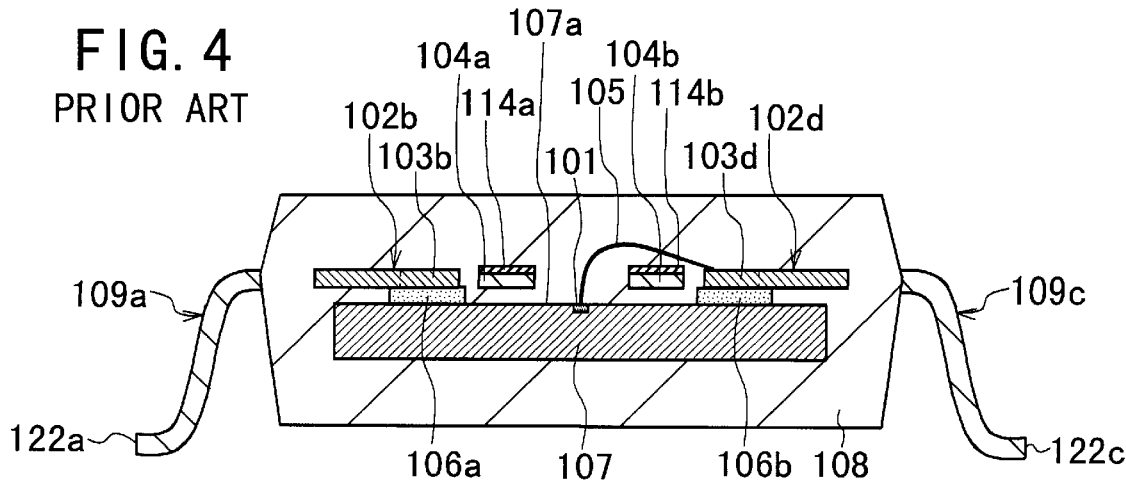
FIG. 4 is a cross-sectional view of still another conventional plastic-encapsulated semiconductor device having the bus-bars with insulating layers, which is along the same line as the line II—II in FIG. 1.

Preferred embodiments of the present invention will be described in detail below while referring to the drawings attached.

FIRST EMBODIMENT

A plastic-encapsulated semiconductor device according to a first embodiment of the present invention has a LOC package structure, as shown in FIG. 5 and FIGS. 6A, 6B, and 6C.

Figure 5:
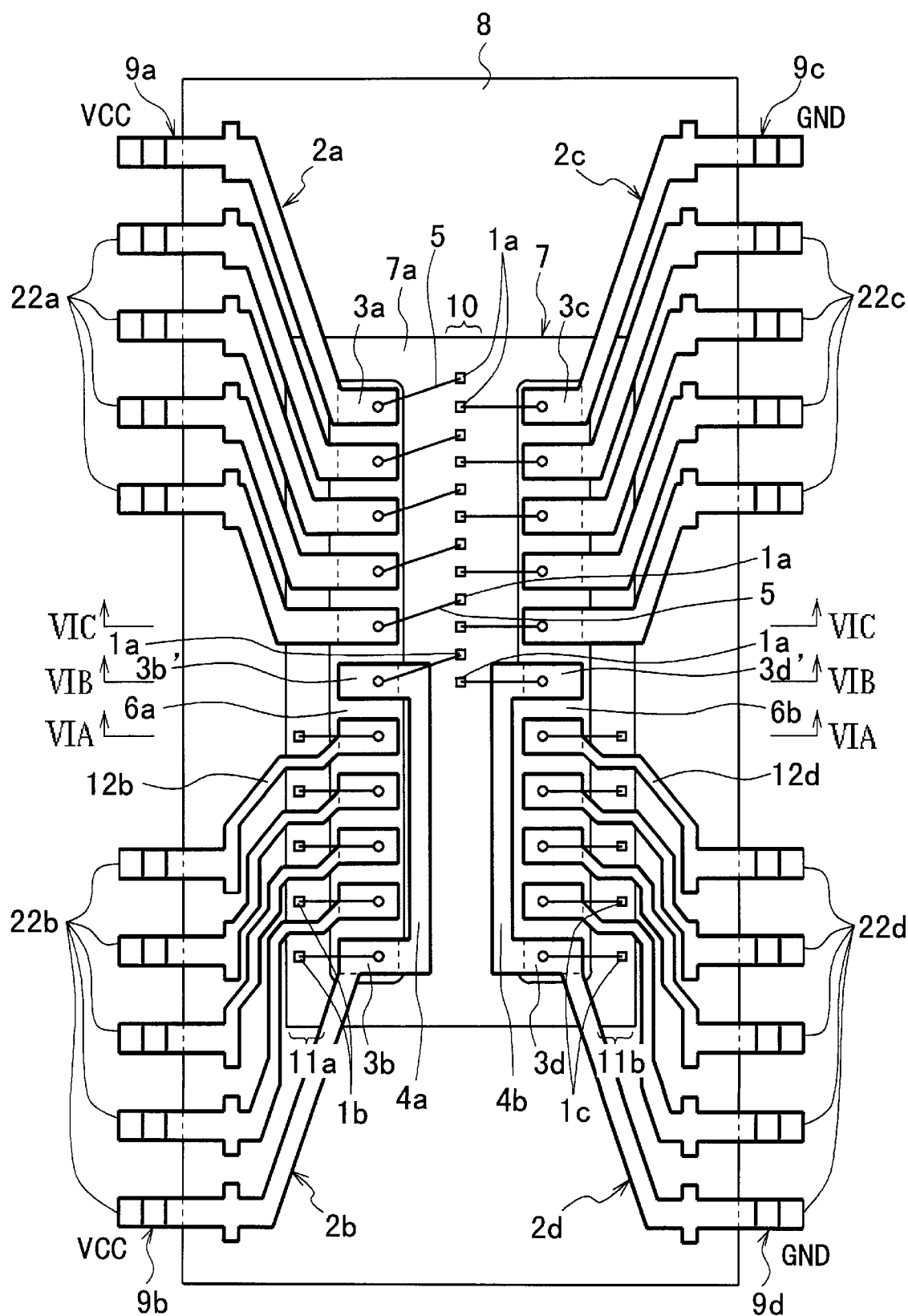
FIG. 5 is a schematic plan view showing the structure of a LOC package of a plastic-encapsulated semiconductor device according to a first embodiment of the present invention, in which the upper half of the package is removed.

As shown in FIG. 5, this semiconductor device is comprised of an IC chip 7, bonding pads 1a, 1b, and 1c provided on the top surface or bonding surface 7a of the chip 7, lead fingers 22a, 22b, 22c, and 22d, metal bonding wires 5, and a plastic package 8. The package 8 has a shape of an approximately rectangular parallelepiped.

Unlike the chip 107 in the conventional semiconductor device with the "center pad structure" shown in FIG. 1, this semiconductor device has the bonding pads 1a located in a central pad area 10 of the top surface 7a of the chip 7, the bonding pads 1b located in a first peripheral pad area 11a thereof located on its one side (on the left-hand side in FIG. 5), and the bonding pads 1c located in a second peripheral pad area 11a thereof located on its opposite side (on the right-hand side in FIG. 5) to the first peripheral pad area 11a. Also, first and second bus-bars 4a and 4b are provided to reinforce the power and ground lines for the chip 7.

The bonding pads 1a in the central pad area 10 are arranged along a straight line at regular intervals, thereby forming a row of the pads 1a. The row of the pads 1a is located in only one half of the surface 7a (in only an upper half in FIG. 5).

The bonding pads 1b in the first peripheral pad area 11a are arranged along a straight line at regular intervals, thereby forming a row of the pads 1b. The row of the pads 1b is located in only another half of the top surface 7a (in only a lower half in FIG. 5) on one end thereof (on the left-hand side end in FIG. 5).

The bonding pads 1c in the second peripheral pad area 11b are arranged along a straight line at regular intervals, thereby forming a row of the pads 1c. The row of the pads 1c is located in only the same half of the top surface 7a as the pads 1b (in only the lower half in FIG. 5) on an opposite end thereof to the pads 1b (on the right-hand side end in FIG. 5).

The rows of the bonding pads 1a, 1b, and 1c extend in parallel to each another.

First and second double-coated, non-conductive adhesion tapes 6a and 6b, which are usually made of a polyimide (PI) film, are arranged on the top surface 7a of the chip 7 at each side of the central area 10 in such a way that the tapes 6a and 6b extend in parallel to the rows of the pads 1a, 1b, and 1c from the outer end of the row of the pads 1a to the opposite outer ends of the rows of the pads 1b and 1c. These two tapes 6a and 6b have a same length, a same width, and a same thickness. The coated lower faces of the first and second tapes 6a and 6b are attached to the surface 7a to be fixed thereon.

The first tape 6a, which is commonly used for the pads 1a and 1b, is located in an intervening area of the surface 7a between the central pad area 10 and the first peripheral pad area 11a. The second tape 6b, which is commonly used for the pads 1a and 1c, is located in an intervening area of the surface 7a between the central pad area 10 and the second peripheral pad area 11b. Therefore, the row of the pads 1a in the central pad area 10 is sandwiched by the first and second tapes 6a and 6b. The row of the pad 1b in the first peripheral pad area 11a is located at the outer end of the first tape 6a (at the left-hand side end in FIG. 5). The row of the pad 1c in the second peripheral pad area 11b is located at the outer end of the second tape 6b (at the right-hand side end in FIG. 5).

As seen from FIG. 5, two ones of the pads 1a in the central pad area 10 (which are connected the two lead fingers 9a labeled "VCC" in FIG. 5) are used as first and second power terminals of the IC chip 7 through which a power supply voltage VCC is supplied to the inner circuits of the chip 7.

Other two ones of the pads 1a in the central pad area 10 (which are connected the two lead fingers 9c labeled "GND" in FIG. 5) are used as first and second ground terminals of the IC chip 7 through which a ground potential GND is applied to the inner circuits of the chip 7. The remaining pads 1a are used as signal terminals.

One of the pads 1b in the first peripheral pad area 11a (which is connected the lead finger 9b labeled "VCC" in FIG. 5) is used as a third power terminal of the IC chip 7 through which the power supply voltage VCC is supplied to the inner circuits of the chip 7. One of the pads 1c in the second peripheral pad area 11b (which is connected the lead finger 9d labeled "GND" in FIG. 5) is used as a third ground terminal of the IC chip 7 through which the ground potential GND is applied to the inner circuits of the chip 7. The remaining pads 1b and 1c are used as signal terminals.

The lead fingers 22a, 22b, 22c, and 22d are formed by a metallic leadframe, which is typically made of Alloy 42 or a copper alloy. The inner ends of the lead fingers 22a, 22b, 22c, and 22d serve as bonding areas (i.e., stitches) 3a, 3b, 3c, and 3d, respectively, at which the bonding wires 5 are stitch-bonded to the individual fingers 22a, 22b, 22c, and 22d. One of the lead fingers 22b (which is labeled "VCC") has an extension portion constituting the first bus-bar 4a. One of the lead fingers 22d (which is labeled "GND") has an extension portion constituting the second bus-bar 4b.

The stitches 3a, 3b, 3c, and 3d, which usually have a same width of approximately 1 mm from their tips, are usually covered with a plated metal layer such as silver (Ag). The bonding wires 5, which are usually made of gold (Au) or a gold alloy, have a diameter of approximately 23 to 30 µm.

The first and second bus-bars 4a and 4b, which are made of the same material as that of the lead fingers 22a, 22b, 22c, and 22d, are located between the first and second tapes 6a and 6b so as to extend apart from one another in parallel to the tapes 6a and 6b.

The first bus-bar 4a is located in an strip-shaped intervening area between the central pad area 10 and the adjoining first tape 6a. An end of the first bus-bar 4a is mechanically joined to the corresponding one (which is labeled "VCC") of the lead fingers 22b. A bonding area or stitch 3b' is formed on an opposite end of the first bus-bar 4a to the corresponding lead finger 22b. This stitch 3b' is located between the group of the lead fingers 22a and the group of the lead fingers 22b. The first bus-bar 4a is attached to the coated upper face of the first tape 6a at the stitch 3b', thereby fixing the end part of the first bus-bar 4a to the chip 7.

The second bus-bar 4b is located in an strip-shaped intervening area between the central pad area 10 and the adjoining second tape 6b. An end of the second bus-bar 4b is mechanically joined to the corresponding one (which is labeled "GND") of the lead fingers 22d. A bonding area or stitch 3d' is formed on an opposite end of the second bus-bar 4b to the corresponding lead finger 22d. This stitch 3d' is located between the group of the lead fingers 22c and the group of the lead fingers 22d. The second bus-bar 4b is attached to the coated upper face of the second tape 6b at the stitch 3d', thereby fixing the end part of the second bus-bar 4b to the chip 7.

The lead fingers 22a, which are provided for the bonding pads 1a in the central pad area 10, are attached at their stitches 3a to the coated upper face of the first tape 6a, thereby fixing the fingers 22a to the surface 7a of the chip 7. As shown in FIG. 5, one of the fingers 22a (which is labeled "VCC") serves as a first power line through which the power supply voltage VCC is supplied to the inner circuits of the rc chip 7, and is electrically connected to a corresponding one of the bonding pads 1a in the central pad area 10 serving as the first power terminal through a corresponding one of the bonding wires 5. The remaining fingers 22a are used as signal lines.

The first bus-bar 4a is electrically connected at its stitch 3b' to a corresponding one of the pads 1a serving as the second power terminal in the central pad area 10 through a corresponding one of the bonding wires 5.

The lead fingers 22b, which are provided for the bonding pads 1b in the first peripheral pad area 11a, are attached at their stitches 3b to the coated upper face of the first tape 6a, thereby fixing the fingers 22b to the surface 7a of the chip 7. As shown in FIG. 5, one of the fingers 22b serves as a second power line (which is labeled "VCC") through which the power supply voltage VCC is supplied to the inner circuits of the IC chip 7, and is electrically connected to a corresponding one of the bonding pads 1b in the first peripheral area 11a serving as the third power terminal through a corresponding one of the bonding wires 5. Also, the finger 22b serving as the second power line is electrically connected to the bonding pad 1a serving as the second power terminal in the central pad area 10 through the first bus-bar 4a and a corresponding one of the bonding wires 5. The remaining fingers 22b are used as signal lines.

The lead fingers 22c, which are provided for the bonding pads 1a in the central pad area 10, are attached at their stitches 3c to the coated upper face of the second tape 6b, thereby fixing the fingers 22c to the surface 7a of the chip 7. As shown in FIG. 5, one of the fingers 22c (which is labeled "GND") serves as a first ground line through which the ground potential GND is applied to the inner circuits of the IC chip 7, and is electrically connected to a corresponding one of the bonding pads 1a in the central pad area 10 serving as the first ground terminal through a corresponding one of the bonding wires 5. The remaining fingers 22c are used as signal lines.

The second bus-bar 4b is electrically connected at its stitch 3d' to a corresponding one of the pads 1a serving as the second ground terminal in the central pad area 10 through a corresponding one of the bonding wires 5.

The lead fingers 22d, which are provided for the bonding pads 1c in the second peripheral pad area 11b, are attached at their stitches 3d to the coated upper face of the second tape 6b, thereby fixing the fingers 22d to the surface 7a of the chip 7. As shown in FIG. 5, one of the fingers 22d (which is labeled "GND") serves as a second ground line through which the ground potential GND is applied to the inner circuits of the IC chip 7, and is electrically connected to a corresponding one of the bonding pads 1c in the second peripheral area 11b serving as the third ground terminal through a corresponding one of the bonding wires 5. Also, the finger 22d serving as the second ground line is electrically connected to the bonding pad 1a serving as the second ground terminal in the central pad area 10 through the second bus-bar 4b and a corresponding one of the bonding wires 5. The remaining fingers 22d are used as signal lines.

Each of the lead fingers 22a, 22b, 22c, and 22d is electrically connected to a corresponding or adjoining one of the bonding pads 1a, 1b, and 1c at its bonding area or stitch 3a, 3b, 3c, or 3d by a stitch-bonding process through the metallic bonding wire 5.

Each of the lead fingers 22b is fixed to extend between the adjoining ones of the bonding pads 1b in the first peripheral pad area 11a so as not to be contacted with the corresponding bonding wires 5. Similarly, each of the lead fingers 22d is fixed to extend between the adjoining ones of the bonding pads 1c in the second peripheral pad area 11b so as not to be contacted with the corresponding bonding wires 5. To ensure the post-molding separation of the fingers 22b and 22d from the corresponding bonding wires 5, each of the fingers 22b has a narrow middle portion 12b and each of the fingers 22d has a narrow middle portion 12d.

The IC chip 7, the bonding wires 5, the first and second bus-bars 4a and 4b, and the inner portions or inner leads 2a, 2b, 2c, and 2d of the lead fingers 22a, 22b, 22c, and 22d are encapsulated in the plastic package 8.

Only the outer portions or outer leads 9a, 9b, 9c, and 9d of the lead fingers 22a, 22b, 22c, and 22d are located outside the package 8, thereby providing I/O terminals of this semiconductor device.

With the above-described plastic-encapsulated semiconductor device according to the first embodiment of the present invention, the IC chip 7 has the bonding pads 1a arranged in the central pad area 10, the bonding pads 1b arranged in the first peripheral pad area 11a, and the bonding pads 1c arranged in the second peripheral pad area 11b on its top surface 7a.

Figure 6A:
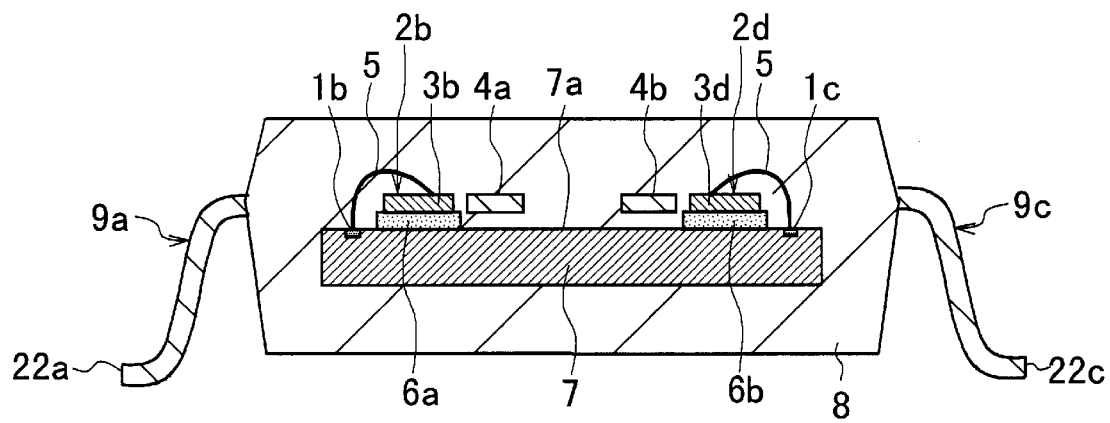
FIG. 6A is a cross-sectional view along the line VIA—VIA in FIG. 5.
Figure 6B:
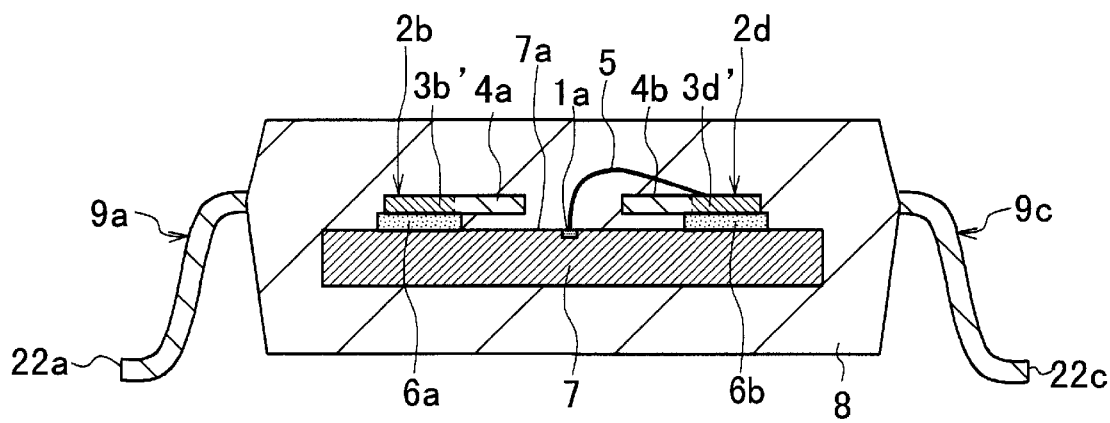
FIG. 6B is a cross-sectional view along the line VIB—VIB in FIG. 5.
Figure 6C:
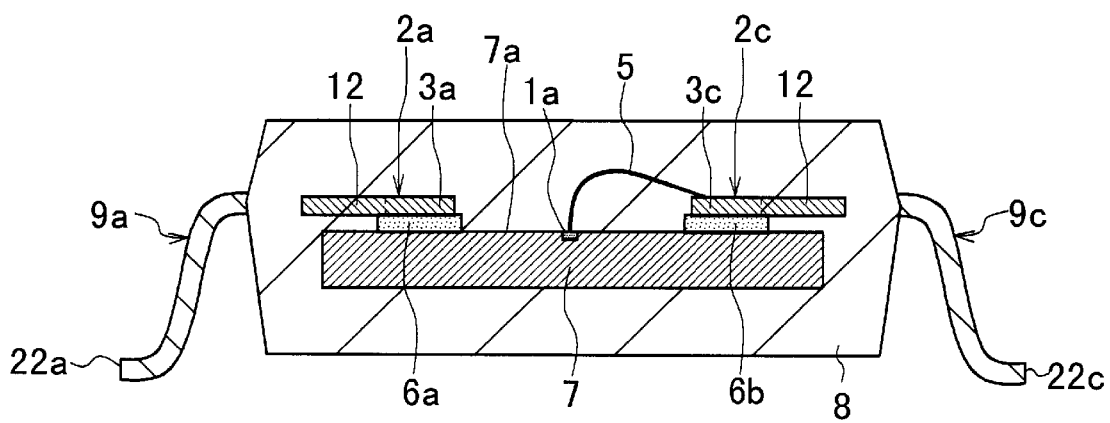
FIG. 6C is a cross-sectional view along the line VIC—VIC in FIG. 5.

Further, as clearly seen from FIGS. 6A, 6B, and 6C, the first and second bus-bars 4a and 4b are formed to extend over the top surface 7a of the IC chip 7 in such a way that the bonding wires 5 electrically connecting the bonding pads 1a arranged in the central pad area 10 to the corresponding ones of the lead fingers 22a and 22b do not overlap with the first and second bus-bars 4a and 4b. This means that the first bus-bar 4a is formed not to extend to the intervening area between the bonding pads 1a in the central pad area 10 and the lead fingers 22a electrically connected thereto, and that the second bus-bar 4b is formed not to extend to the intervening area between the bonding pads 1a in the central pad area 10 and the lead fingers 22b electrically connected thereto.

Therefore, the first and second power lines for supplying the power supply voltage VCC to the IC chip 7 and the first and second ground lines for applying the ground potential GND to the chip 7 are able to be reinforced by the first and second bus-bars 4a and 4b without using the over-lead bonding technique. This means that the halt-etching process of the bus-bars 4a and 4b is unnecessary, and a metallic leadframe for the lead fingers 22a, 22b, 22c, and 22d can be readily fabricated by a pressing or stamping operation.

Also, since the over-lead bonding technique is unnecessary, there is no possibility that the first and/or second bus-bars 4a and/or 4b is/are contacted with the bonding wires 5. Thus, the failure rate of the semiconductor device due to the contact or touching of the bonding wires 5 with the first and/or second bus-bars 4a and/or 4b is decreased. This means that the fabrication yield of a leadframe used for the lead fingers 22a, 22b, 22c, and 22d and the bonding yield of the bonding wires 5 are improved.

As seen from FIG. 6B, since the two bonding wires 5 bonded to the first and second bus-bars 4a and 4b extend over the bus-bars 4a and 4b, respectively, these wires 5 may be contacted with the bus-bars 4a and 4b after the molding process of the plastic package 8. In this case, however, there is no problem, because these wires 5 are not contacted with unwanted, different conductors.

In the first embodiment, each of the first and second bus-bars 4a and 4b has the single stitch 3b' or 3d'. However, it is needless to say that two or more stitches may be formed in each of the first and second bus-bars 4a and 4b as necessary.

According to the inventor's test, the bonding failure rate occurring due to the electrical short between the bonding wires 5 and the bus-bar 4a or 4b was approximately 0.8% in the conventional device shown in FIG. 1. On the other hand, in the device according to the first embodiment, the failure rate was decreased to 0%.

SECOND EMBODIMENT

Figure 7:
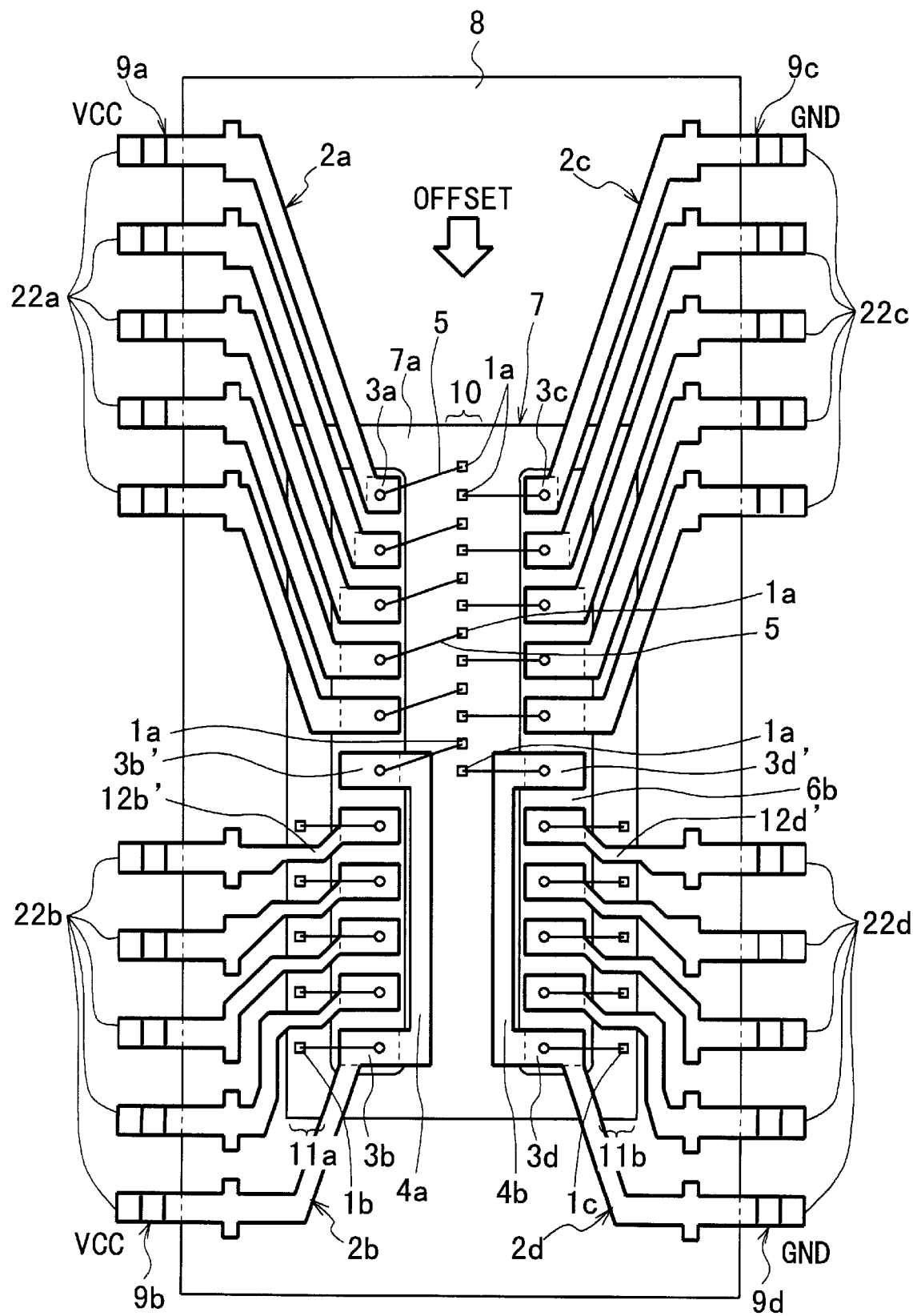
FIG. 7 is a schematic plan view showing the structure of a LOC package of a plastic-encapsulated semiconductor device according to a second embodiment of the present invention, in which the upper half of the package is removed.

FIG. 7 shows a plastic-encapsulated semiconductor device according to a second embodiment of the present invention.

This semiconductor device according to the second embodiment has the same configuration as that of the semiconductor device according to the first embodiment shown in FIG. 5 except that the IC chip 7 is located at a position shifted along a plane parallel to the chip 7 (the lower orientation in FIG. 7) with respect to the package and the outer portions 9a, 9b, 9c, and 9d of the lead fingers 22a, 22b, 22c, and 22d. Therefore, explanation about the same configuration as that of the first embodiment is omitted here by attaching the same reference numerals to the same elements in FIG. 7 for the sake of simplification of description.

In the second embodiment, because of the above positional shift of the IC chip 7, the bending angle of the inner portions (i.e., inner leads) 2b and 2d of the lead fingers 22b and 22d becomes larger than that in the first embodiment. In other words, the inter-lead spacing of the lead fingers 22b and 22d becomes wider than that in the first embodiment. Accordingly, as seen from FIG. 7, the middle portions 12b' of the lead fingers 22b for the bonding pads 1b arranged in the first peripheral pad area 11a are wider than the middle portions 12b in the first embodiment. Also, the middle portions 12d' of the lead fingers 22d for the bonding pads 1d arranged in the second peripheral pad area 11b are wider than the middle portions 12d in the first embodiment.

As a result, there is an additional advantage that the width or thickness of the inner portions (i.e., inner leads) 2b and 2d of the lead fingers 22b and 22d can be increased, thereby raising the strength of a leadframe. This improves further the fabrication yield of a metallic leadframe for the lead fingers 22a, 22b, 22c, and 22d and the bonding yield of the bonding wires 5.

The shift distance of the chip 7 may be suitably and optionally designed, However, to prevent crack failure of the plastic package 8 from occurring during the reflow process in the subsequent assembling stage carried out under heat generated by an electrical resistance heater, it is preferred that the smallest thickness of the package 8 between the surface of the package 8 and the opposing end of the chip 7 is 0.5 mm or greater.

In the second embodiment, the length of the stitches 3a and 3c of the lead fingers 22a and 22c provided for the bonding pads 1a arranged in the central pad area 10 tends to be shorter than that in the first embodiment due to the shift of the chip 7. This decreases the bonding or attachment strength of the lead fingers 22c and 22d to the first and second tapes 6a and 6b, resulting in the bonding failure. Accordingly, it was found that the length of the stitches 3a and 3c is preferably 0.8 mm or longer.

According to the inventor's tests, the thickness of the inner leads 2b and 2d in the second embodiment was able to be increased by approximately twice as much as that in the first embodiment or greater. The deformation rate of the inner leads 2b and 2d in the second embodiment was decreased to approximately one-tenth (1/10) as much as that in the first embodiment. The bonding failure rate of the bonding wires 5 in the second embodiment was improved compared with the first embodiment. The specific test results are shown in Table 1 shown below.

The specimens of the semiconductor devices according to the first and second embodiments used in the tests were as follows.

Package size: 10.16 mm×20.91 mm
IC chip size: 7.15 mm×13.92 mm
I/O pin count: 50

TABLE 1

|  | EMBODIMENT 1 | EMBODIMENT 2 |
| --- | --- | --- |
| LEAD WIDTH | 0.125 mm | 0.3 mm |
| LEAD DEFORMATION | 0.03% | 0.005% |
| FAILURE RATE | 0.35% | 0.05% |

While the preferred embodiments of the present invention have been described, it is to be understood that modifications will be apparent to those skilled in the art without departing from the spirit of the invention. The scope of the invention, therefore, is to be determined solely by the following claims.

What is claimed is:

1. A plastic-encapsulated semiconductor device comprising:
   (a) an IC chip having a surface having (i) a top portion on which a first plurality of bonding pads are provided, and (ii) a bottom portion on which a second plurality of bonding pads are provided;
   said first plurality of bonding pads being arranged in a central area of the top portion of said surface, and said second plurality of bonding pads being arranged in a peripheral area of the bottom portion of said surface;
   (b) lead fingers whose inner ends are fixed to said surface of said IC chip;
   at least one of said lead fingers serving as a part of a power/ground line for said IC chip;
   (c) a bus-bar mechanically and electrically connected to said at least one of said lead fingers serving as a part of said power/ground line;
   said bus-bar extending over said surface of said IC chip;
   (d) bonding wires for electrically connecting said inner ends of said lead fingers and said bus-bar to corresponding ones of said first and second pluralities of bonding pads; and
   (e) a plastic package for encapsulating said IC chip, inner portions of said lead fingers, said bus-bar, and said bonding wires, while protruding outer portions of said lead fingers from said package;
   said bus-bar being formed to extend over said central area of said surface of said IC chip such that said bonding wires electrically connecting said first plurality of bonding pads to corresponding ones of said lead fingers do not extend over said bus-bar.

2. The device as claimed in claim 1, further comprising a non-conductive tape attached onto said surface of said IC chip;
   wherein said inner ends of said lead fingers are attached to said tape, thereby fixing said lead fingers to said surface of said IC chip.

3. The device as claimed in claim 2, wherein said bus-bar is attached to said tape.

4. The device as claimed in claim 1, wherein one of said first plurality of bonding pads located near a center of said surface of said IC chip, which serves as a power/ground terminal of said IC chip, is electrically connected to said power/ground line through said bus-bar and a corresponding one of said bonding wires.

5. The device as claimed in claim 1, wherein said lead fingers electrically connected to said second plurality of bonding pads have narrow portions located near said second plurality of bonding pads.

6. The device as claimed in claim 1, wherein said IC chip is located at a position shifted along a plane parallel to said chip with respect to said outer portions of said lead fingers, thereby decreasing a bending angle of said inner portions of said lead fingers electrically connected to said second plurality of bonding pads.

7. A plastic-encapsulated semiconductor device comprising:
   (a) an IC chip having a surface having (i) a top portion on which a first plurality of bonding pads are provided, and (ii) a bottom portion on which a second plurality of bonding pads, and a third plurality of bonding pads are provided;
   said first plurality of bonding pads being arranged in a central area of the top portion of said surface;
   said second plurality of bonding pads being arranged in a first peripheral area of the bottom portion of said surface;
   said third plurality of bonding pads being arranged in a second peripheral area of the bottom portion of said surface located in an opposite side to said first peripheral area;
   (b) lead fingers whose inner ends are fixed to said surface of said IC chip;
   at least two ones of said lead fingers serving as parts of first and second power/ground lines for said IC chip;
   (c) a first bus-bar mechanically and electrically connected to a corresponding one of said lead fingers serving as a part of said first power/ground line;
   said first bus-bar extending over said surface of said IC chip;
   (d) a second bus-bar mechanically and electrically connected to a corresponding one of said lead fingers serving as a part of said second power/ground line;
   said second bus-bar extending over said surface of said IC chip;
   (e) bonding wires for electrically connecting said inner ends of said lead fingers and said first and second bus-bars to corresponding ones of said first, second, and third pluralities of bonding pads; and
   (f) a plastic package for encapsulating said IC chip, inner portions of said lead fingers, said first and second bus-bars, and said bonding wires, while protruding outer portions of said lead fingers from said package;
   said first and second bus-bars being formed to extend over said central area of said surface of said IC chip such that said bonding wires electrically connecting said first plurality of bonding pads to corresponding ones of said lead fingers do not extend over said first and second bus-bars.

8. The device as claimed in claim 7, further comprising a non-conductive tape attached onto said surface of said IC chip;
   wherein said inner ends of said lead fingers are attached to said tape, thereby fixing said lead fingers to said surface of said IC chip.

9. The device as claimed in claim 8, wherein said first and second bus-bars are attached to said tape.

10. The device as claimed in claim 7, wherein two ones of said first plurality of bonding pads located near a center of said surface of said IC chip, which serve as power/ground terminals of said IC chip, are electrically connected to said first and second power/ground lines through said first and second bus-bars and corresponding ones of said bonding wires, respectively.

11. The device as claimed in claim 7, wherein said lead fingers electrically connected to said second and third pluralities of bonding pads have narrow portions located respectively near said second and third pluralities of bonding pads.

12. The device as claimed in claim 7, wherein said IC chip is located at a position shifted along a plane parallel to said chip with respect to said outer portions of said lead fingers, thereby decreasing a bending angle of said inner portions of said lead.

13. A plastic-encapsulated semiconductor device comprising:

(a) an IC chip having a surface having (i) a top portion on which a first plurality of bonding pads are provided, and (ii) a bottom portion on which a second plurality of bonding pads are provided;

said first plurality of bonding pads being arranged along a first straight line in a central area of the top portion of said surface, and said second plurality of bonding pads being arranged along a second straight line in a peripheral area of the bottom portion of said surface, with said first and said second straight lines running parallel to one another;

(b) lead fingers whose inner ends are fixed to said surface of said IC chip;

at least one of said lead fingers serving as a part of a power/ground line for said IC chip;

(c) a bus-bar mechanically and electrically connected to said at least one of said lead fingers serving as a part of said power/ground line;

said bus-bar extending over said surface of said IC chip;

(d) bonding wires for electrically connecting said inner ends of said lead fingers and said bus-bar to corresponding ones of said first and second pluralities of bonding pads; and (e) a plastic package for encapsulating said IC chip, inner portions of said lead fingers, said bus-bar, and said bonding wires, while protruding outer portions of said lead fingers from said package;

said bus-bar being formed to extend over said central area of said surface of said IC chip such that said bonding wires electrically connecting said first plurality of bonding pads to corresponding ones of said lead fingers do not extend over said bus-bar.

14. A plastic-encapsulated semiconductor device comprising:

(a) an IC chip having a surface having (i) a top portion on which a first plurality of bonding pads are provided, and (ii) a bottom portion on which a second plurality of bonding pads, and a third plurality of bonding pads are provided;

said first plurality of bonding pads being arranged along a first straight line in a central area of the top portion of said surface;

said second plurality of bonding pads being arranged along a second straight line in a first peripheral area of the top portion of said surface;

said third plurality of bonding pads being arranged along a third straight line in a second peripheral area of the bottom portion of said surface located in an opposite side to said first peripheral area, with said first, said second, and said third plurality straight lines running parallel to one another;

(b) lead fingers whose inner ends are fixed to said surface of said IC chip;

at least two ones of said lead fingers serving as parts of first and second power/ground lines for said IC chip;

(c) a first bus-bar mechanically and electrically connected to a corresponding one of said lead fingers serving as a part of said first power/ground line;

said first bus-bar extending over said surface of said IC chip;

(d) a second bus-bar mechanically and electrically connected to a corresponding one of said lead fingers serving as a part of said second power/ground line;

said second bus-bar extending over said surface of said IC chip;

(e) bonding wires for electrically connecting said inner ends of said lead fingers and said first and second bus-bars to corresponding ones of said first, second, and third pluralities of bonding pads; and (f) a plastic package for encapsulating said IC chip, inner portions of said lead fingers, said first and second bus-bars, and said bonding wires, while protruding outer portions of said lead fingers from said package;

said first and second bus-bars being formed to extend over said central area of said surface of said IC chip such that said bonding wires electrically connecting said first plurality of bonding pads to corresponding ones of said lead fingers do not extend over said first and second bus-bars.

* * * * *